(12) United States Patent
Park et al.

(10) Patent No.: US 8,035,101 B2
(45) Date of Patent: Oct. 11, 2011

(54) TRANSISTOR, SEMICONDUCTOR DEVICE INCLUDING A TRANSISTOR AND METHODS OF MANUFACTURING THE SAME

(75) Inventors: Sungho Park, Yongin-si (KR); Ihun Song, Seongnam-si (KR); Kiha Hong, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 12/385,743

(22) Filed: Apr. 17, 2009

(65) Prior Publication Data
US 2010/0102397 A1  Apr. 29, 2010

(30) Foreign Application Priority Data
Oct. 27, 2008 (KR) .................. 10-2008-0105474

(51) Int. Cl.
*H01L 29/12* (2006.01)
(52) U.S. Cl. .................. 257/43; 257/392; 257/E27.061; 257/E29.273
(58) Field of Classification Search ............. 257/40, 257/43, 59, 72, 402, 392, E27.061, E27.062, 257/E29.273, E29.275
See application file for complete search history.

(56) References Cited

U.S. PATENT DOCUMENTS

| | | | | |
|---|---|---|---|---|
| 5,808,595 | A | * | 9/1998 | Kubota et al. .................. 345/92 |
| 2005/0017302 | A1 | * | 1/2005 | Hoffman ....................... 257/347 |
| 2006/0284172 | A1 | * | 12/2006 | Ishii ............................. 257/43 |
| 2007/0090351 | A1 | * | 4/2007 | Park et al. ...................... 257/40 |

* cited by examiner

*Primary Examiner* — Victor A Mandala
*Assistant Examiner* — Scott Stowe
(74) *Attorney, Agent, or Firm* — Harness, Dickey & Pierce, P.L.C.

(57) ABSTRACT

A transistor, a semiconductor device including the transistor and methods of manufacturing the same are provided, the transistor including a threshold voltage adjusting layer contacting a channel layer. A source electrode and a drain electrode contacting may be formed opposing ends of the channel layer. A gate electrode separated from the channel layer may be formed. A gate insulating layer may be formed between the channel layer and the gate electrode.

23 Claims, 12 Drawing Sheets

TRANSISTOR, SEMICONDUCTOR DEVICE INCLUDING A TRANSISTOR AND METHODS OF MANUFACTURING THE SAME

PRIORITY STATEMENT

This application claims the benefit of priority under 35 U.S.C. §119 from Korean Patent Application No. 10-2008-0105474, filed on Oct. 27, 2008, in the Korean Intellectual Property Office, the disclosure of which is incorporated herein in its entirety by reference.

BACKGROUND

1. Field

Example embodiments relate to a transistor and a method of manufacturing the same. Other example embodiments relate to a semiconductor device including a transistor and a method of manufacturing the same.

2. Description of the Related Art

Transistors are widely used as switching devices or driving devices in the field of electronic equipment. In particular, because thin film transistors (TFTs) may be fabricated on a glass substrate or a plastic substrate, TFTs are mainly used in flat panel display apparatuses (e.g., liquid crystal display (LCD) devices) and organic light emitting display (OLED) apparatuses.

In order to achieve the desired operational properties of transistors, attempts have been made to utilize an oxide layer having high carrier mobility (e.g., a ZnO-based material layer) as a channel layer. The above method is mainly applied to TFTs for the flat panel display apparatuses.

In the transistors having the oxide layer as the channel layer (hereinafter, referred to as "conventional oxide transistors"), it may be difficult to control a threshold voltage. If a silicon layer is used as the channel layer, n-channel metal-oxide semiconductor (NMOS) transistors and p-channel metal-oxide semiconductor (PMOS) transistors may be more easily fabricated by changing the kind of elements doped in the channel layer. In addition, the threshold voltage may be controlled by adjusting the concentration of the doped elements. According to the oxide material transistor, it may difficult to control the threshold voltage by the doping due to a self-compensation.

The channel layer formed of the oxide material may be primarily formed of an n-channel layer. The conventional oxide transistors are mainly depletion mode transistors of which the threshold voltage is less than 0 volts.

SUMMARY

Example embodiments relate to a transistor and a method of manufacturing the same. Other example embodiments relate to a semiconductor device including a transistor and a method of manufacturing the same.

Example embodiments include a transistor having a threshold voltage adjusting layer and a method of manufacturing the same. Other example embodiments also include a semiconductor device including the above transistor.

Example embodiments include a transistor having a first channel layer, a first threshold voltage adjusting layer contacting the first channel layer, a first source electrode and a first drain electrode contacting both (or opposing)ends of the first channel layer, respectively, a first gate electrode separated from the first channel layer, and a first gate insulating layer disposed between the first channel layer and the first gate electrode, wherein the first channel layer is disposed between the first threshold voltage adjusting layer and the first gate insulating layer.

The first threshold voltage adjusting layer may have a work function that is different from a work function of the first channel layer. The first threshold voltage adjusting layer may be separated from the first source electrode and the first drain electrode. The first threshold voltage adjusting layer may include at least one of a metal and a semiconductor. The semiconductor may be doped with conductive impurities.

The first channel layer may be an oxide layer. The first gate electrode may be formed above or below the first channel layer.

The transistor may include an insulating layer that is formed on the first threshold voltage adjusting layer and that has a hole that exposes a part (or portion) of the first threshold voltage adjusting layer, wherein the first channel layer contacts the exposed part (or portion) of the first threshold voltage adjusting layer.

The first threshold voltage adjusting layer may be formed on a substrate, and the first channel layer may cover a top surface and side surfaces of the first threshold voltage adjusting layer.

The transistor may include an insulating layer having a groove on a substrate, wherein the first threshold voltage adjusting layer is disposed in the groove. The first channel layer may be formed on the insulating layer to cover the first threshold voltage adjusting layer.

Example embodiments also include a semiconductor device having a first transistor and a second transistor, wherein the first transistor is the transistor described above.

The first transistor and the second transistor may have threshold voltages that are different from each other. One of the first and second transistors may be an enhancement mode transistor and the other of the first and second transistors may be a depletion mode transistor.

The second transistor may include a second channel layer, a second threshold voltage adjusting layer contacting the second channel layer, a second source electrode and a second drain electrode contacting both (or opposing) ends of the second channel layer, respectively, a second gate electrode separated from the second channel layer, and a second gate insulating layer disposed between the second channel layer and the second gate electrode, wherein the second channel layer is disposed between the second threshold voltage adjusting layer and the second gate insulating layer.

The second threshold voltage adjusting layer may have a work function that is different from a work function of the second channel layer. The work function of the first threshold voltage adjusting layer may be larger than the work function of the first channel layer. The work function of the second threshold voltage adjusting layer may be smaller than the work function of the second channel layer.

According to other example embodiments, the work function of the first threshold voltage adjusting layer may be smaller than the work function of the first channel layer, and the work function of the second threshold voltage adjusting layer may be larger than the work function of the second channel layer.

The second threshold voltage adjusting layer may be separated from the second source electrode and the second drain electrode. The second threshold voltage adjusting layer may include at least one of a metal and a semiconductor. The semiconductor may be doped with conductive impurities.

The first and second channel layers may include the same material as each other.

The semiconductor device may be a logic device.

Additional aspects will be set forth in part in the description which follows and, in part will be apparent from the description, or may be learned by practice.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Figure 1:
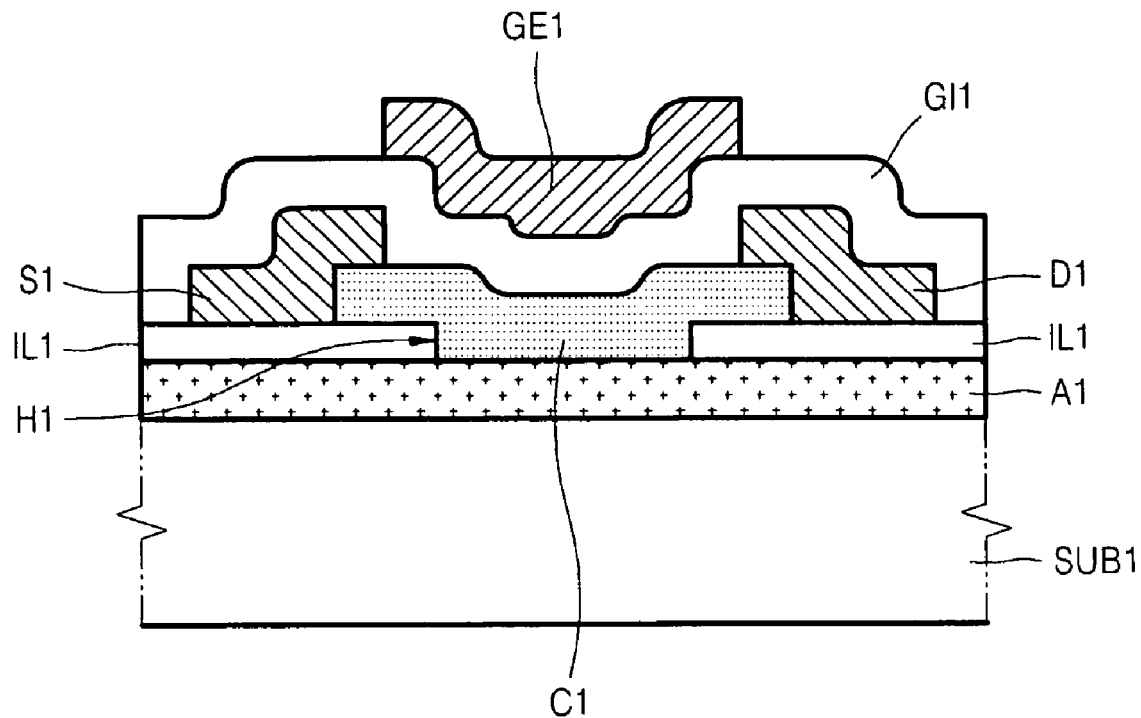
FIGS. 1 through 4 are cross-sectional views of transistors according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

In order to more specifically describe example embodiments, various aspects will be described in detail with reference to the attached drawings. However, the present invention is not limited to example embodiments described.

Example embodiments relate to a transistor and a method of manufacturing the same. Other example embodiments relate to a semiconductor device including a transistor and a method of manufacturing the same.

Figure 2:
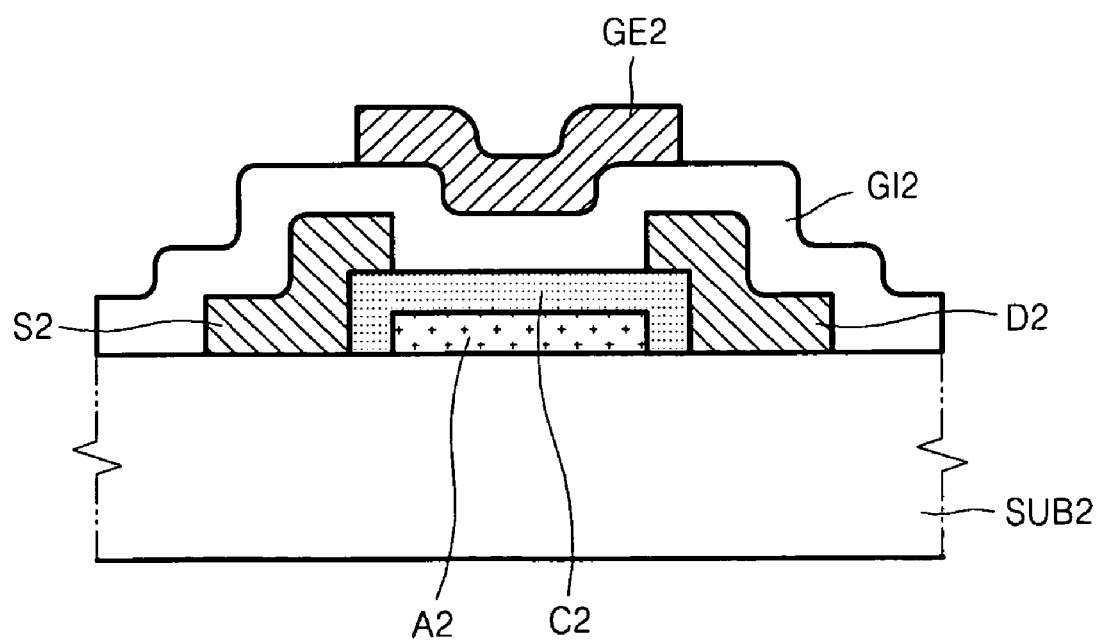
Figure 3:
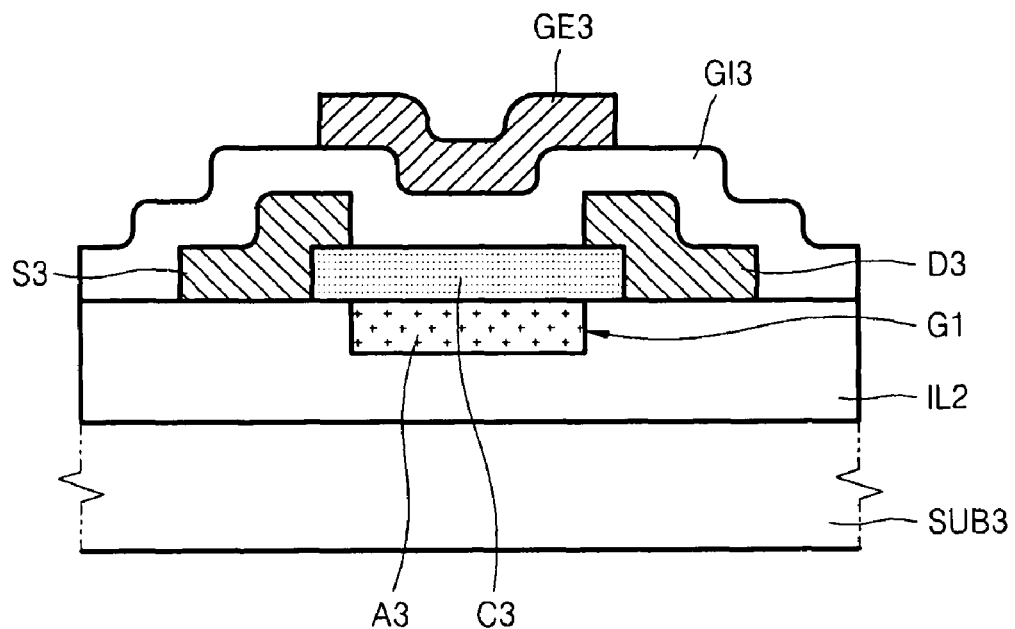

FIGS. 1 through 3 are cross-sectional views of transistors according to example embodiments.

The transistors shown in FIGS. 1-3 are thin film transistors (TFTs) having a top-gate structure, in which gate electrodes GE1-GE3 are formed above channel layers C1-C3.

Referring to FIG. 1, a threshold voltage adjusting layer A1 may be disposed on a substrate SUB1. The substrate SUB1 may be one selected from the group consisting of a silicon substrate, a glass substrate and a plastic substrate. The substrate SUB 1 may be transparent or opaque. The threshold voltage adjusting layer A1 may cover an entire top surface of the substrate SUB1. The threshold voltage adjusting layer A1 may be patterned in a desired shape.

The threshold voltage adjusting layer A1 may be a metal layer or a semiconductor layer. The threshold voltage adjusting layer A1 may be a layer including metal and semiconductor. The semiconductor layer of the threshold voltage adjusting layer A1 may be a non-oxide layer (e.g., a silicon layer). The semiconductor layer of the threshold voltage adjusting layer A1 may be doped with conductive impurities in a substantially high concentration. According to other example embodiments, the semiconductor layer is not restricted to the non-oxide layer or the highly-doped layer. The semiconductor layer may be an oxide layer, a layer doped with conductive impurities in a low concentration or a non-doped layer.

The threshold voltage adjusting layer A1 may have a work function that is different from that of the channel layer C1 contacting a part of the threshold voltage adjusting layer A1. The threshold voltage adjusting layer A1 will be described in more detail later.

An insulating layer IL1 having a hole H1 that exposes a part of the top surface of the threshold voltage adjusting layer A1 may be formed on part of the threshold voltage adjusting layer A1. The channel layer C1, which contacts the part of the threshold voltage adjusting layer A1 that is exposed by the hole H1, may be formed on the insulating layer IL1.

The channel layer C1 may be an n-type or a p-type semiconductor layer, or may be an oxide layer. For example, the channel layer C1 may be an n-type semiconductor layer including a zinc oxide (ZnO)-based material. If the channel layer C1 is a n-type semiconductor layer, the channel layer C1 may include a Group-III element (e.g., indium (In) and gallium (Ga)), a Group-IV element (e.g., tin (Sn)), or other elements. If the channel layer C1 is a p-type semiconductor layer, the channel layer C1 may be a copper (Cu) oxide layer, a nickel (Ni) oxide layer, a Ni oxide layer doped with titanium (Ti), a ZnO-based oxide layer doped with silver (Ag) or combinations thereof. If the channel layer C1 is a p-type semiconductor layer, the channel layer C1 may be a ZnO-based oxide layer doped with at least one selected from the group consisting of Group-I elements, Group-II elements, Group-V elements and combinations thereof. If the channel layer C1 is formed of an oxide material, the channel layer C1 may be fabricated using a low temperature process.

A source electrode S1 and a drain electrode D1 that contact respective both (or opposing) ends of the channel layer C1 may be formed on a part of the insulating layer IL1. The source electrode S1 and the drain electrode D1 may be formed of a conductive material that is generally used in semiconductor devices (e.g., metal). A Schottky barrier may exist between the source electrode S1 and the channel layer C1. A Schottky barrier may exist between the drain electrode D1 and the channel layer C1. A gate insulating layer GI1, which covers the channel layer C1, the source electrode S1, and the drain electrode D1, may be formed on the insulating layer IL1. The gate insulating layer GI1 may be formed of a silicon oxide material, a silicon nitride material or another insulating material. The insulating material may be a high-K material (e.g., hafnium (Hf) oxide, aluminum (Al) oxide, lanthanum (La) oxide, zirconium (Zr) oxide, hafnium-silicon (HfSi) oxide, HfSi nitride-oxide, hafnium-lanthanum (HfLa) oxide, lanthanum-aluminum (LaAl) oxide, strontium-titanium (SrTi) oxide) or combinations thereof).

The gate electrode GE1 may be formed on the gate insulating layer GI1 above the channel layer C1. The gate electrode GE1 may be formed as a conductive layer generally used in semiconductor devices. The conductive layer may include a conductive material (e.g., $W_2N$, TaSiN, (RE)TaN, WC, TiAlN, MoN, TaCN or combinations thereof), or another metal (e.g., tungsten (W), copper (Cu), aluminum (Al), molybdenum (Mo) or combinations thereof).

Although it is not shown in the drawings, a passivation layer covering the gate electrode GE1 may be formed on the gate insulating layer GI1. The passivation layer may be formed of a silicon (Si) oxide material, a silicon (Si) nitride material or the like.

Referring to FIG. 2, a threshold voltage adjusting layer A2 may be formed on a substrate SUB2. The threshold voltage adjusting layer A2 may be patterned in a desired shape. The patterned threshold voltage adjusting layer A2 may cover a portion of the substrate SUB2. A channel layer C2 may be formed on the substrate SUB2. The channel layer C2 may cover a top surface and side surfaces of the threshold voltage adjusting layer A2. A source electrode S2 and a drain electrode D2 contacting both (or opposing) ends of the channel layer C2 may be formed on the substrate SUB2. A gate insulating layer GI2 may be formed covering the channel layer C2, the source electrode S2 and the drain electrode D2. A gate electrode GE2 may be formed on the gate insulating layer GI2 above the channel layer C2. The substrate SUB2, the threshold voltage adjusting layer A2, the channel layer C2, the source electrode S2, the drain electrode D2, the gate insulating layer GI2 and the gate electrode GE2 may be formed of the same (or similar) materials as those of the substrate SUB1, the threshold voltage adjusting layer A1, the channel layer C1, the source electrode S1, the drain electrode D1, the gate insulating layer GI1 and the gate electrode GE1, respectively.

Referring to FIG. 3, an insulating layer IL2 having a groove G1 may be formed on a substrate SUB3. A threshold voltage adjusting layer A3 may be formed in the groove G1. A channel layer C3 covering the threshold voltage adjusting layer A3 may be formed on a insulating layer IL2. A source electrode S3 and a drain electrode D3 that contact both (or opposing) ends of the channel layer C3 may be formed on the insulating layer IL2. A gate insulating layer GI3 that covers the channel layer C3, the source electrode S3, and the drain electrode D3 may be formed on part (or portion) of the insulating layer IL2. A gate electrode GE3 may be formed on the gate insulating layer GI3 above the channel layer C3. The substrate SUB3, the threshold voltage adjusting layer A3, the channel layer C3, the source electrode S3, the drain electrode D3, the gate insulating layer GI3 and the gate electrode GE3 may be formed of the same (or similar) materials as those of the substrate SUB1, the threshold voltage adjusting layer A1, the channel layer C1, the source electrode S1, the drain electrode D1, the gate insulating layer GI1 and the gate electrode GE1, respectively.

Figure 4:
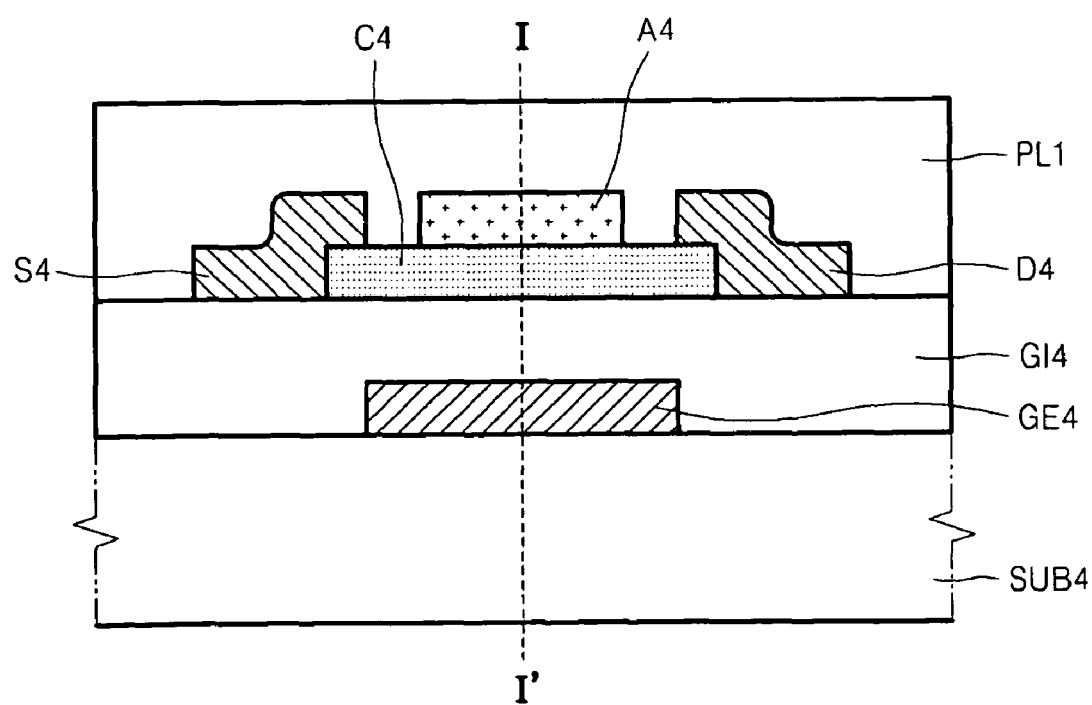

FIG. 4 is a cross-sectional view of a transistor according to example embodiments. The transistor shown in FIG. 4 is a thin film transistor (TFT) having a bottom-gate structure, in which a gate electrode GE4 is formed below a channel layer C4.

Referring to FIG. 4, the gate electrode GE4 is formed on a substrate SUB4. A gate insulating layer GI4 covering the gate electrode GE4 may be formed on the substrate SUB4. The channel layer C4 may be formed on the gate insulating layer GI4 above the gate electrode GE4. A source electrode S4 and a drain electrode D4, which respectively contact both (or opposing) ends of the channel layer C4, may be formed on the gate insulating layer GI4. A threshold voltage adjusting layer A4 may be formed on the channel layer C4 between the source electrode S4 and the drain electrode D4. The threshold voltage adjusting layer A4 may be separated from the source electrode S4 and the drain electrode D4. The substrate SUB4, the threshold voltage adjusting layer A4, the channel layer C4, the source electrode S4, the drain electrode D4, the gate insulating layer GI4 and the gate electrode GE4 may be formed of the same materials as those of the substrate SUB1, the threshold voltage adjusting layer A1, the channel layer C1, the source electrode S1, the drain electrode D1, the gate insulating layer GI1 and the gate electrode GE1, respectively. The threshold voltage adjusting layer A4 shown in FIG. 4 may be formed of the same (or similar) material as those of the source electrode S4 and the drain electrode D4.

The transistors according to example embodiments include the channel layers C1-C4 and the threshold voltage adjusting layers A1-A4 that contact the channel layers C1-C4, respectively. The threshold voltage adjusting layers A1-A4 may be separated from the source electrodes S1-S4 and the drain electrodes D1-D4, respectively. The threshold voltage adjusting layers A1-A4 may be metal layers or doped semiconductor layers. If the threshold voltage adjusting layers A1-A4 contact the source electrodes S1-S4 and the drain electrodes D1-D4, the source electrodes S1-S4 and the drain electrodes D1-D4 may be short-circuited. The channel layers C1-C4 may be disposed between the threshold voltage adjusting layers A1-A4 and the gate insulating layers GI1-GI4, respectively. If the threshold voltage adjusting layers A1-A4 are disposed between the channel layers C1-C4 and the gate insulating layers GI1-GI4, it may be difficult to control operations of the transistors due to the threshold voltage adjusting layers A1-A4 in some cases.

Hereinafter, the properties of the threshold voltage adjusting layers A1-A4 and a principle of controlling a threshold voltage using the threshold voltage adjusting layers A1-A4 will be described as follows.

The threshold voltage adjusting layers A1-A4 have a work function that is different from that of the channel layers C1-C4. If the threshold voltage adjusting layers A1-A4 contact the channel layers C1-C4, energy bands of the channel layers C1-C4 may be changed, causing the threshold voltage of the transistors to change. The change in the threshold voltage will be described in more detail with reference to FIGS. 5-8.

Figure 5:
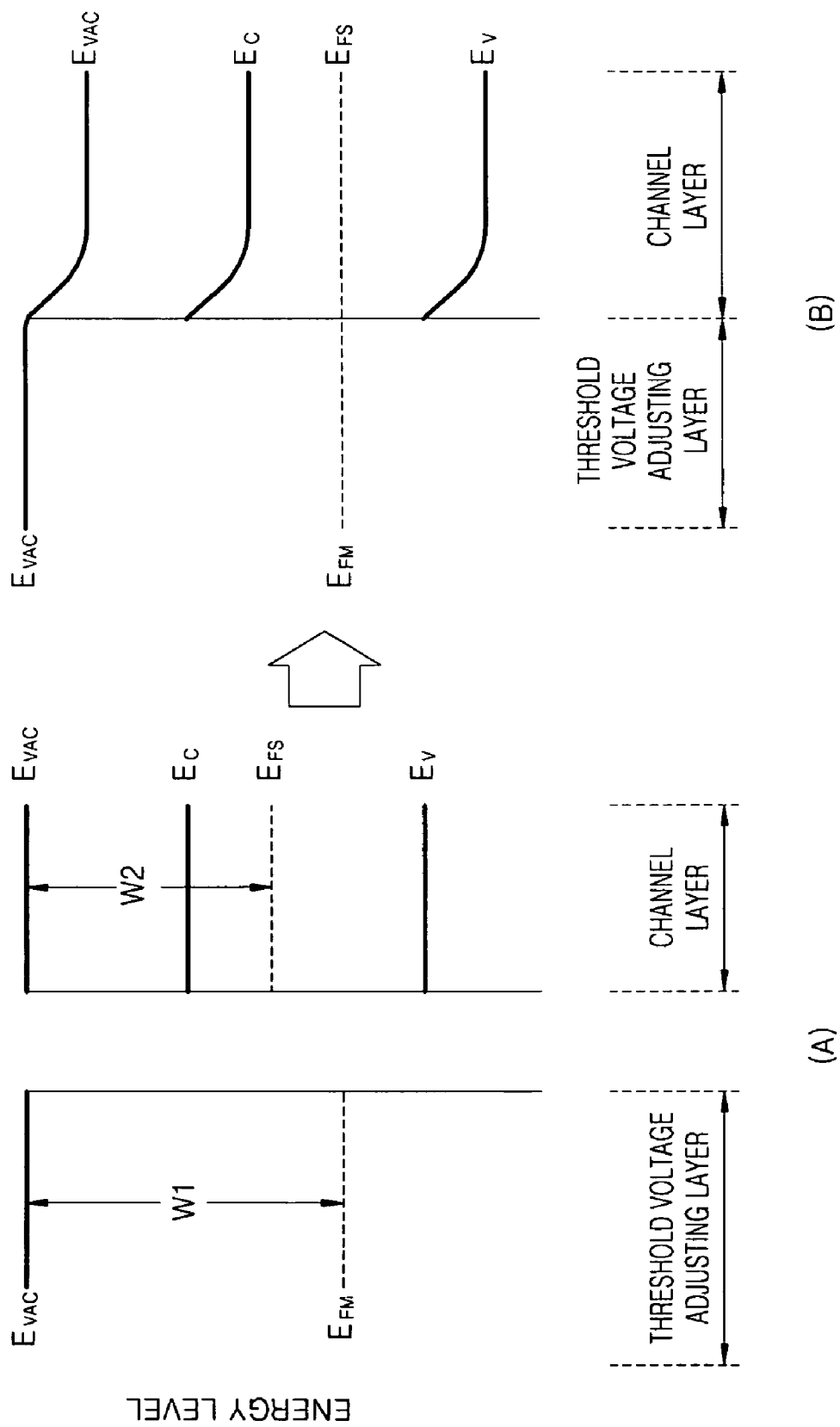
FIGS. 5 through 7 are diagrams showing energy bands of a channel layer and a threshold voltage adjusting layer formed in the transistors according to example embodiments.
Figure 6:
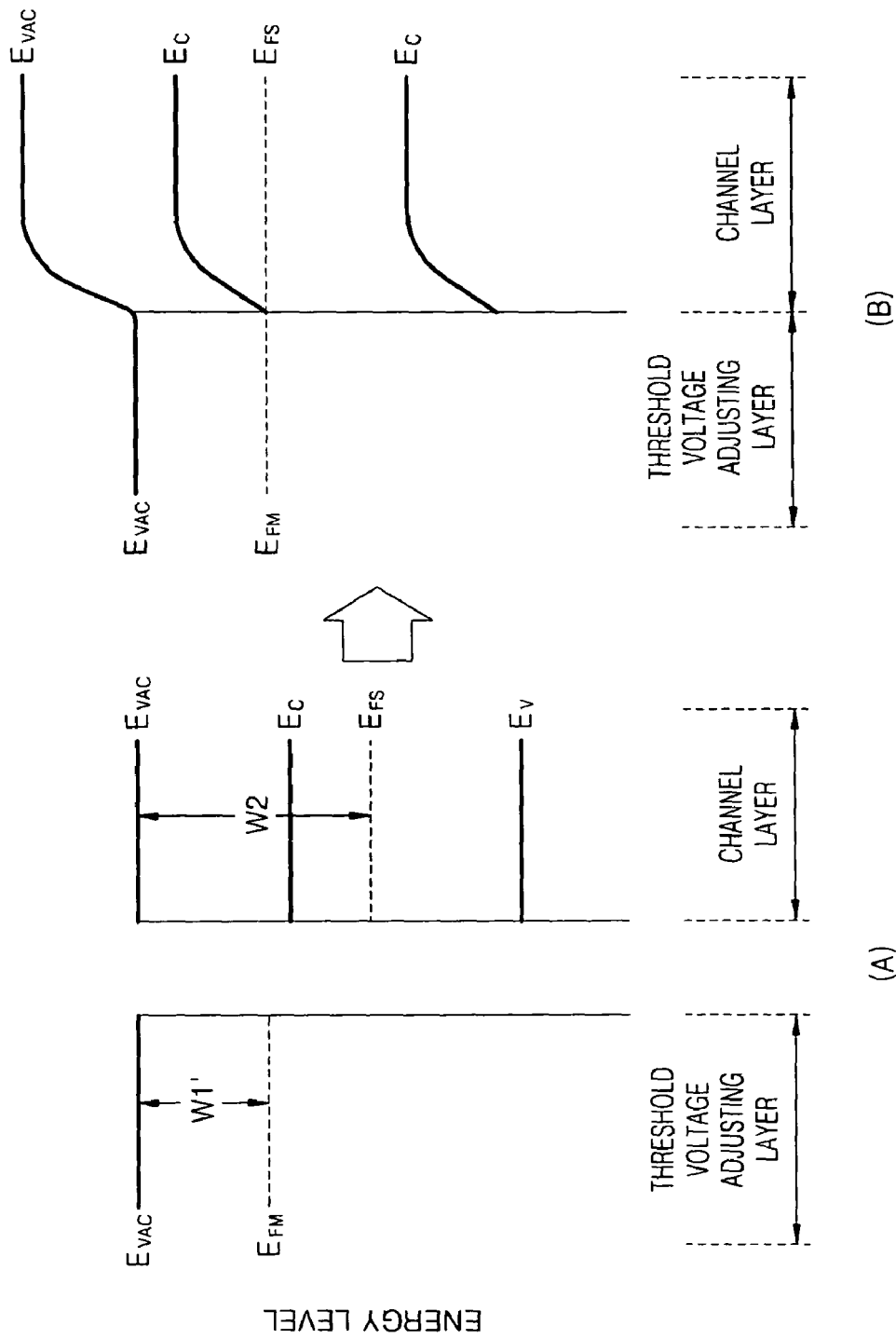
Figure 7:
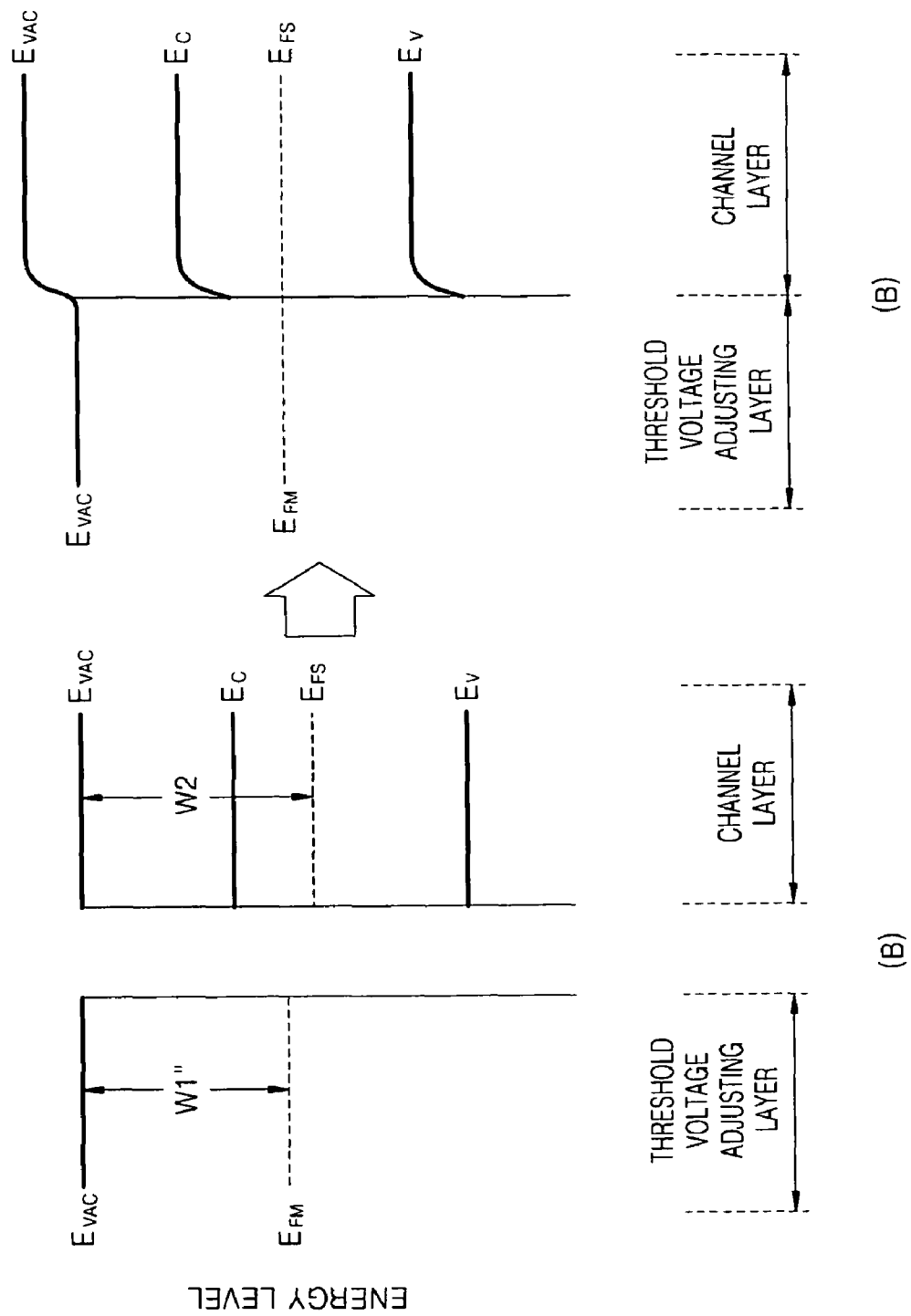

FIGS. 5 through 7 are diagrams showing energy bands of the threshold voltage adjusting layers and the channel layers that may be included in the transistors according to example embodiments. In FIGS. 5-7, graphs (A) show the energy bands before bonding the threshold voltage adjusting layers and the channel layers, and graphs (B) show the energy bands after bonding the threshold voltage adjusting layers and the channel layers. $E_{VAC}$, $E_C$, and $E_V$ denote a vacuum energy level, the lowest energy level of a conduction band and the highest energy level of a valence band, respectively. $E_{FS}$ and $E_{FM}$ denote Fermi energy levels of the channel layers and the threshold voltage adjusting layers, respectively. In the example, the threshold voltage adjusting layer is a metal layer.

Referring to FIG. 5, if the threshold voltage adjusting layer having a work function W1 is bonded to the channel layer having a work function W2 that is smaller than the work function W1, electric charges (e.g., electrons) may move from the channel layer to the threshold voltage adjusting layer at the bonded portion. A depletion region may be generated in the bonded portion of the channel layer. As such, the threshold voltage may increase. That is, if $E_{FS}$ is lowered and the energy band of the channel layer curves upward on (or near) the bonded portion due to bonding of the threshold voltage adjusting layer and the channel layer, the threshold voltage may increase. The threshold voltage adjusting layer having the large work function may include a metal (e.g., nickel (Ni), palladium (Pd), platinum (Pt), iridium (Ir), rhodium (Rh) or combinations thereof), a metal nitride (e.g., TiAlN, MoN, TaCN or combinations thereof), a metal oxide (e.g., indium tin oxide (ITO) and indium zinc oxide (IZO)) or a combination thereof.

Referring to FIG. 6, if the threshold voltage adjusting layer having a work function W1 is bonded with the channel layer having the work function W2 that is larger than the work function W1, the electric charges (e.g., electrons) may move from the threshold voltage adjusting layer to the channel layer at the bonded portion. The electric charges (electrons) increase at the bonded portion of the channel layer, and the threshold voltage of the transistor may decrease. That is, if $E_{FS}$ increases and the energy band of the channel layer curves downward at (or near) the bonded portion due to bonding of the threshold voltage adjusting layer and the channel layer, the threshold voltage may decrease. The threshold voltage adjusting layer having the smaller work function may include a metal (e.g., tantalum (Ta), titanium (Ti), erbium (Er) and combinations thereof), a metal nitride (e.g., $W_2N$, TaSiN, (RE)TaN) and combinations thereof), a metal oxide (e.g., $ITO_x$ and $IZO_x$) or a combination thereof.

In FIG. 7, the threshold voltage adjusting layer has an intermediate work function W1" that is smaller than the work function W1 of FIG. 5 and is larger than the work function W1' of FIG. 6. The intermediate work function W1" of the threshold voltage adjusting layer is not substantially different from the work function W2 of the channel layer as shown in FIG. 7. As such, the threshold voltage of the transistor may be finely adjusted. The threshold voltage adjusting layer having the intermediate work function may include a metal (e.g., cobalt (Co), tungsten (W), molybdenum (Mo) or combinations thereof), and/or a material (e.g., a nitride material or an oxide material) wherein the work function is adjustable.

Figure 8:
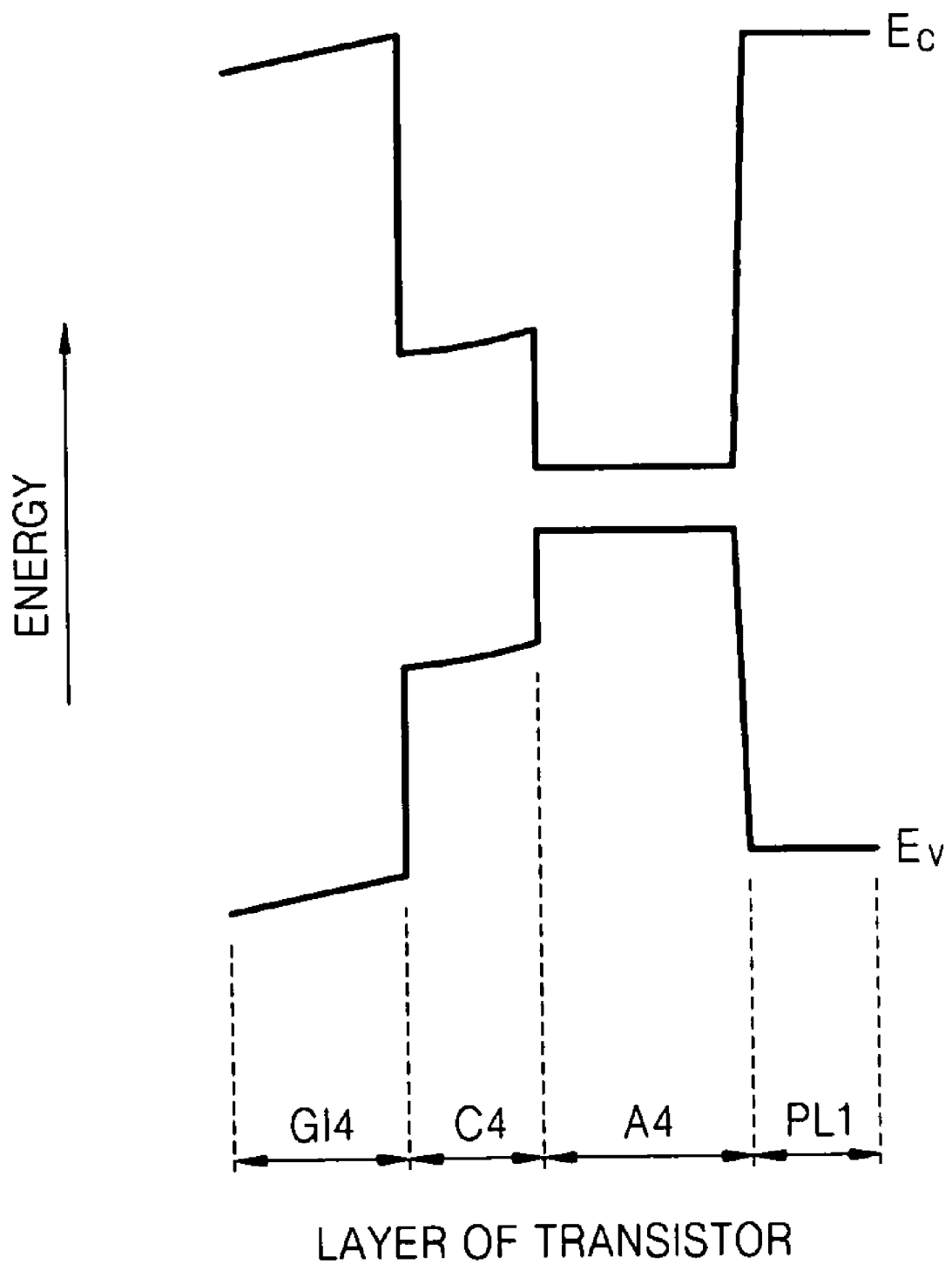
FIG. 8 is a diagram showing energy bands of a gate insulating layer, a channel layer, a threshold voltage adjusting layer, and a protective layer as taken along line I-I' of the transistor of FIG. 4.

FIG. 8 shows energy bands of the gate insulating layer GI4, the channel layer C4, the threshold voltage adjusting layer A4 and the passivation layer PL1 as taken along line I-I' of the transistor of FIG. 4. The energy band of FIG. 8 is obtained if the threshold voltage adjusting layer A4 is a silicon layer doped with n-type impurities in a substantially high concentration and the channel layer C4 is a Zn oxide layer. The thickness of the channel layer C4 is about 100 nm and a carrier concentration of the channel layer C4 is about $1\times10^{16}/cm^3$. The work function of the threshold voltage adjusting layer A4 is about 5.55 eV. The work function of the gate electrode GE4 is about 4.1 eV.

Referring to FIG. 8, the energy band of the channel layer C4 curves upward at the bonded portion between the channel layer C4 and the threshold voltage adjusting layer A4, which indicates that the depletion region is formed in the channel layer C4 at the bonded portion. As such, the threshold voltage of the transistor may be higher than the threshold voltage of the transistor if the threshold voltage adjusting layer A4 is not formed.

Figure 9:
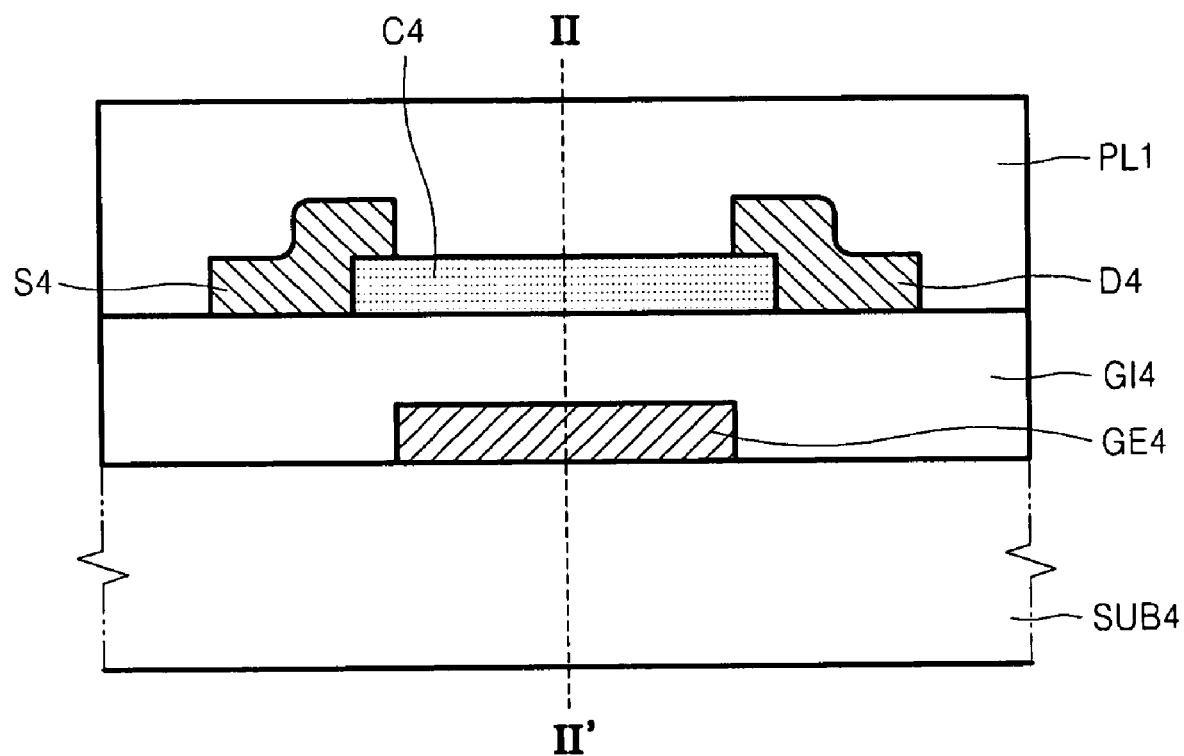
FIG. 9 is a cross-sectional view of a transistor according to a comparative example.

FIG. 9 shows a transistor according to a comparative example. The structure of the transistor shown in FIG. 9 is that same as that of the transistor of FIG. 4, except that the threshold voltage adjusting layer A4 is not formed in the transistor of FIG. 9.

Figure 10:
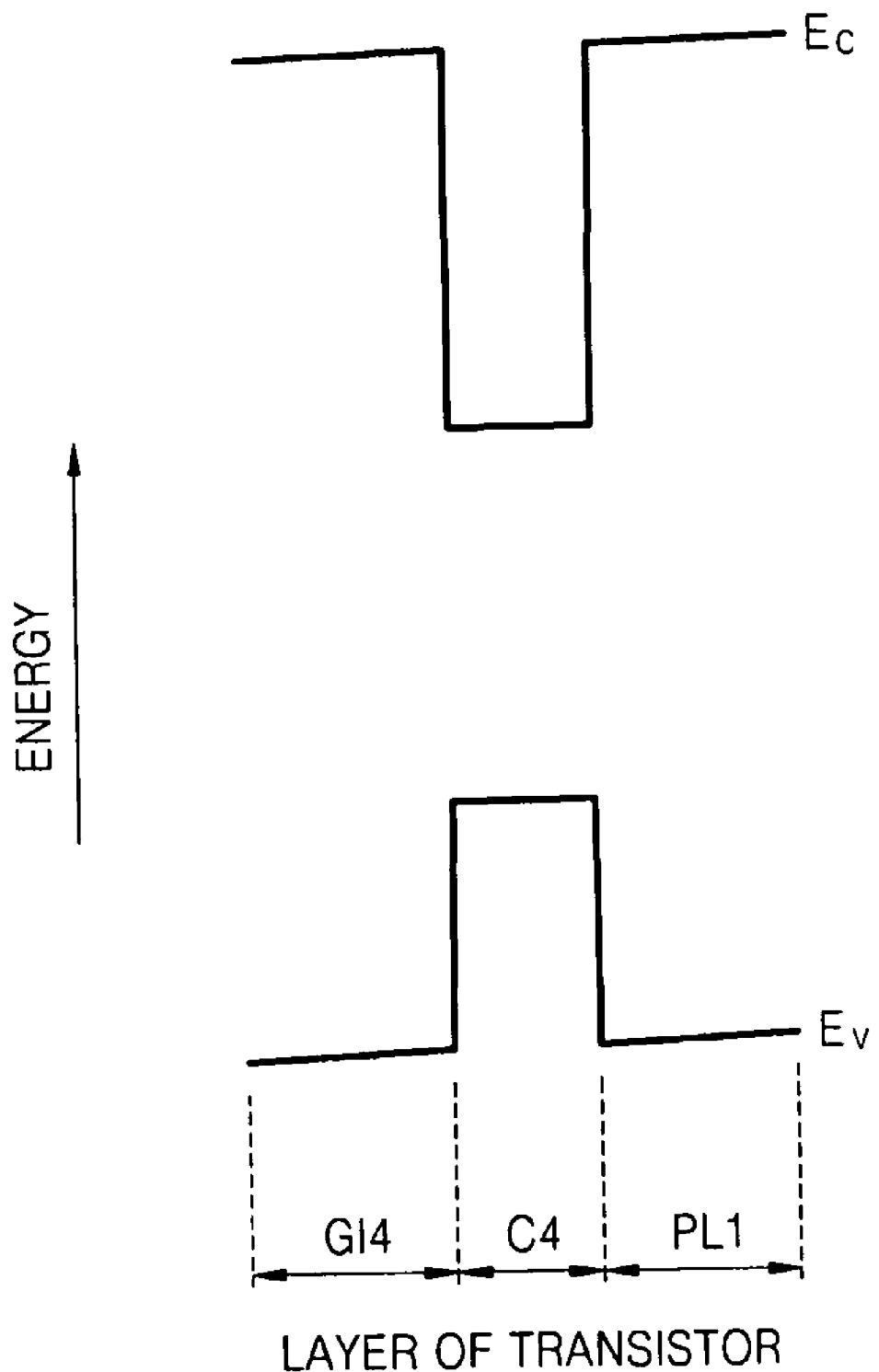
FIG. 10 is a diagram showing energy bands of a gate insulating layer, a channel layer, and a protective layer as taken along line II-II' of the transistor of FIG. 9.

FIG. 10 shows energy bands of the gate insulating layer GI4, the channel layer C4 and the passivation layer PL1 as taken along line II-II' of the transistor of FIG. 9. The materials for forming the channel layer C4 and the gate electrode GE4 are the same as those used to obtain the results of FIG. 8.

Referring to FIG. 10, if the threshold voltage adjusting layer A4 is not formed, $E_c$ and $E_v$ of the channel layer C4 are almost (or substantially) uniform.

Figure 11:
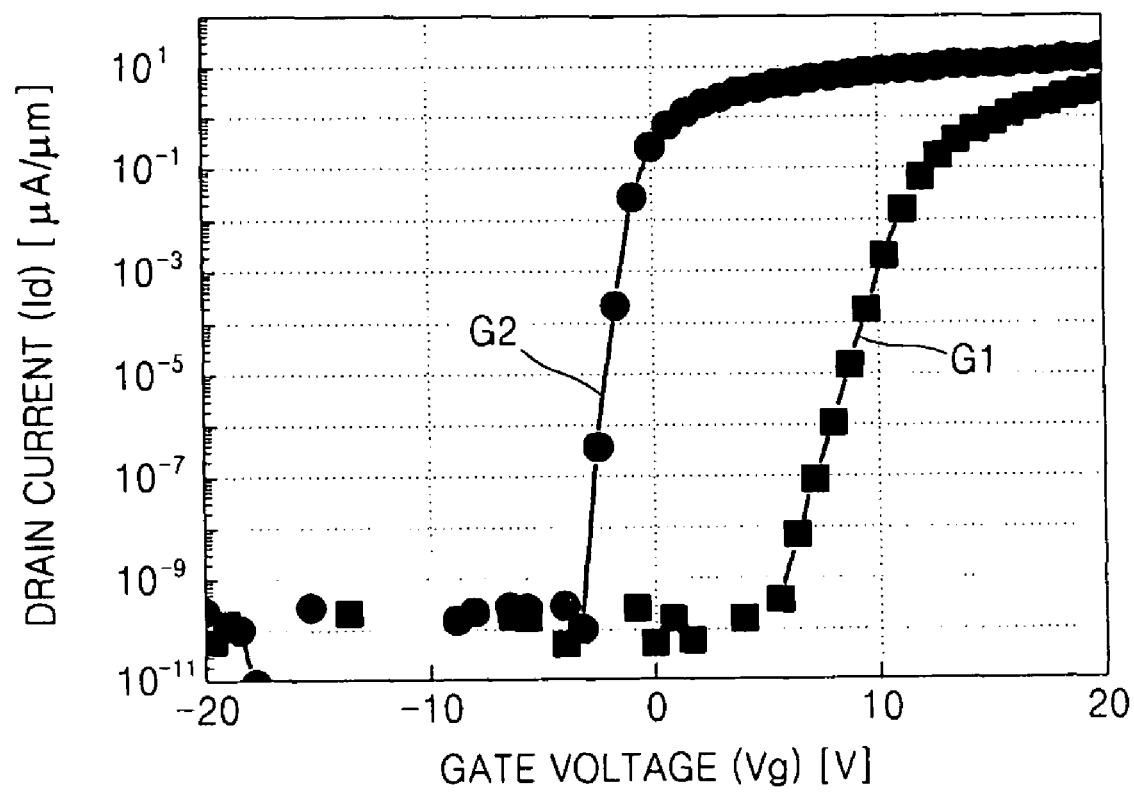
FIG. 11 is a graph showing gate voltages (Vg)-drain currents (Id) in the transistors according to example embodiments and the comparative example.

FIG. 11 shows gate voltage (Vg)-drain current (Id) characteristics of the transistors according to example embodiments and the comparative example.

In FIG. 11, G1 denotes the Vg-Id characteristic of the transistor having the structure shown in FIG. 4. G2 denotes the Vg-Id characteristic of the transistor having the structure of FIG. 9 according to the comparative example. G1 denotes the Vg-Id characteristic of the transistor using (or including) the threshold voltage adjusting layer A4. G2 shows the Vg-Id characteristic of the transistor that does not use (or include) the threshold voltage adjusting layer A4.

Referring to FIG. 11, G1 is located far right of G2. The threshold voltage in G2 is less than 0 volts. The threshold voltage in G1 is greater than 0 volts, which indicates that the threshold voltage of a transistor may be increased by using a threshold voltage adjusting layer. FIG. 11 shows the result if the threshold voltage adjusting layer A4 has a work function that is larger than that of the channel layer C4. Conversely, if the threshold voltage adjusting layer A4 has a work function that is smaller than that of the channel layer C4, the threshold voltage may decrease.

Figure 13:
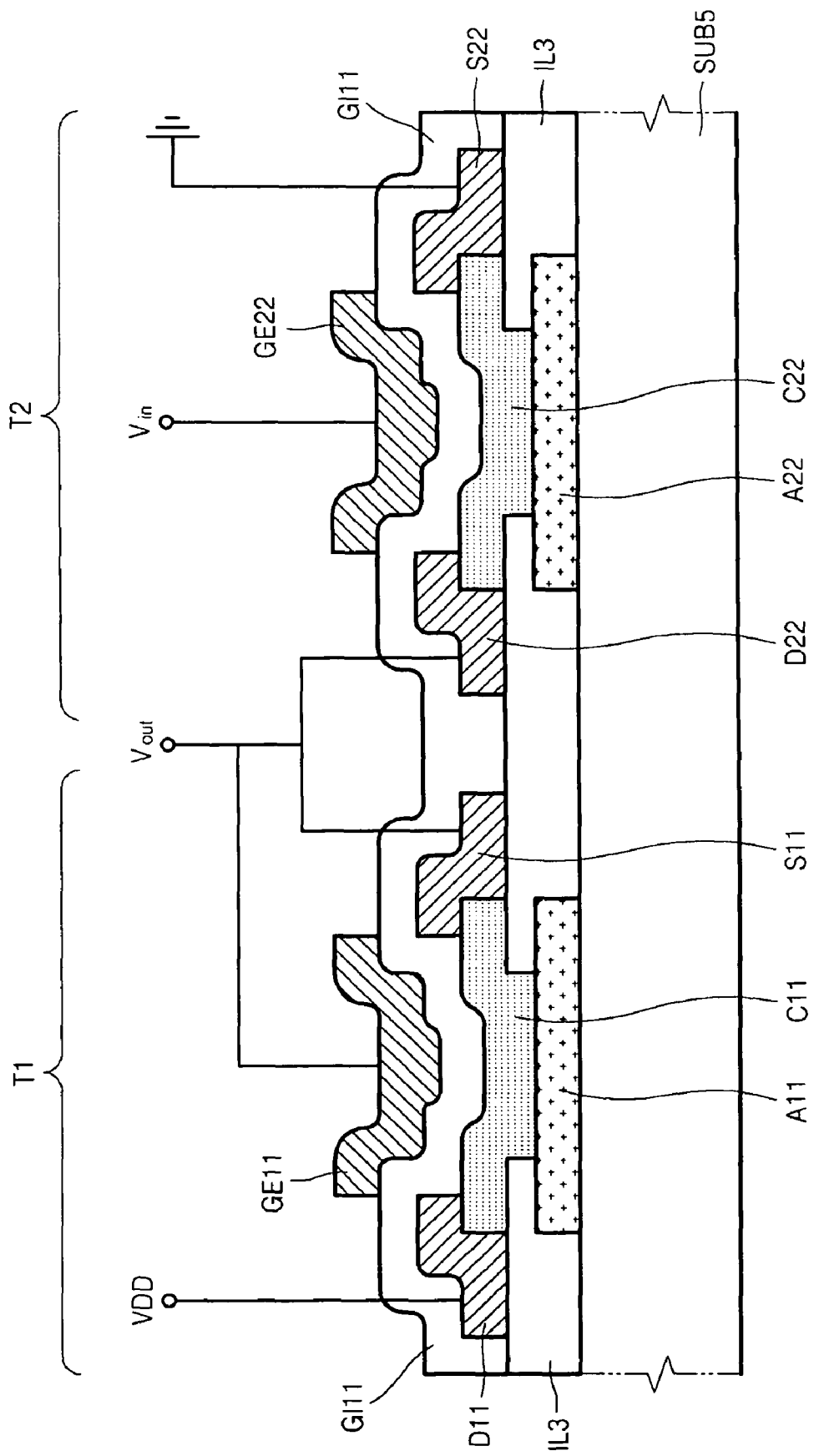
Figure 14:
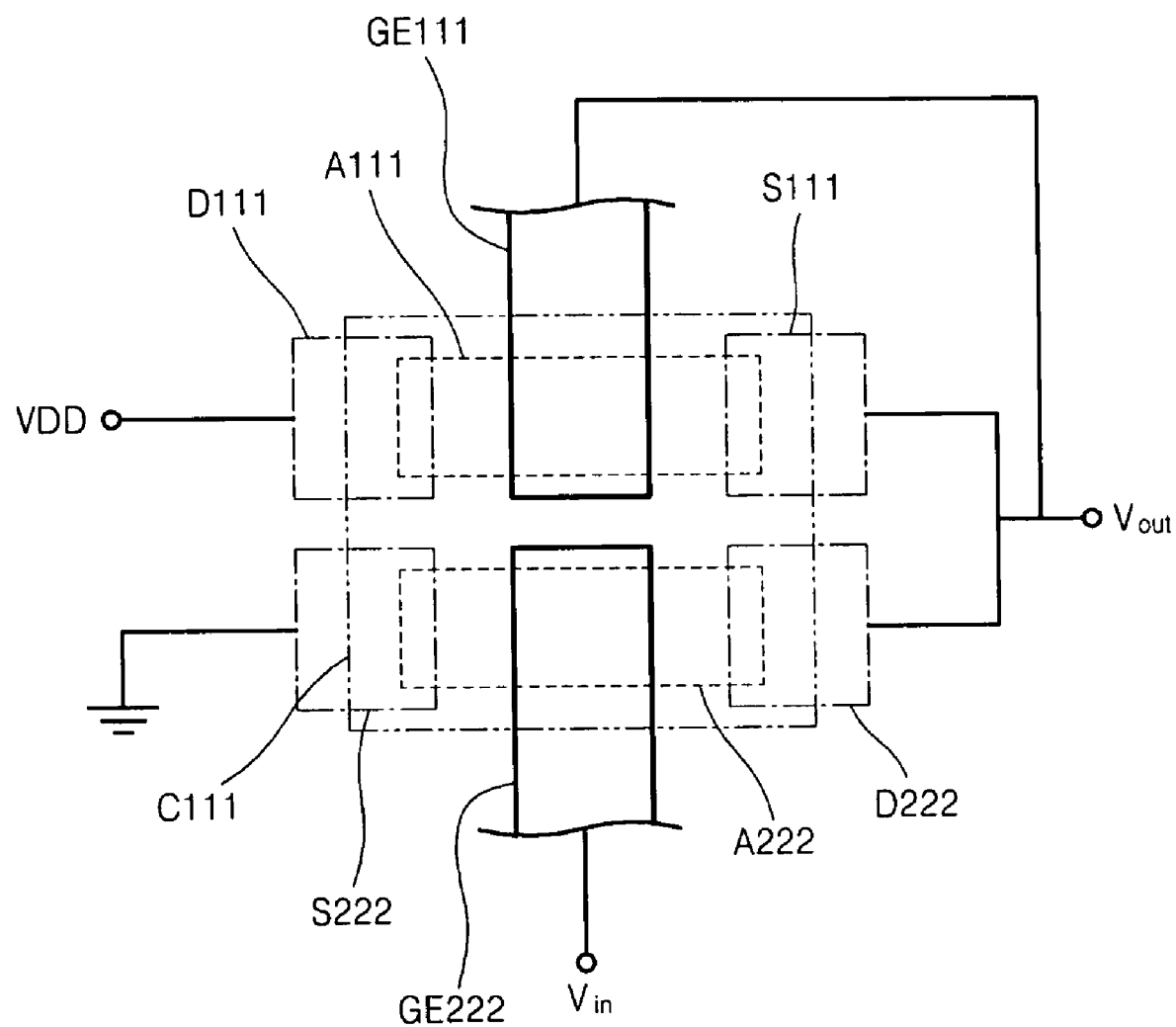
FIG. 14 is a plan view of a semiconductor device according to example embodiments.

The transistors shown in FIGS. 1 through 4 according to example embodiments may be applied to various types of semiconductor devices. Examples of applying the transistors to the semiconductor devices are shown in FIGS. 12 through 14.

Figure 12:
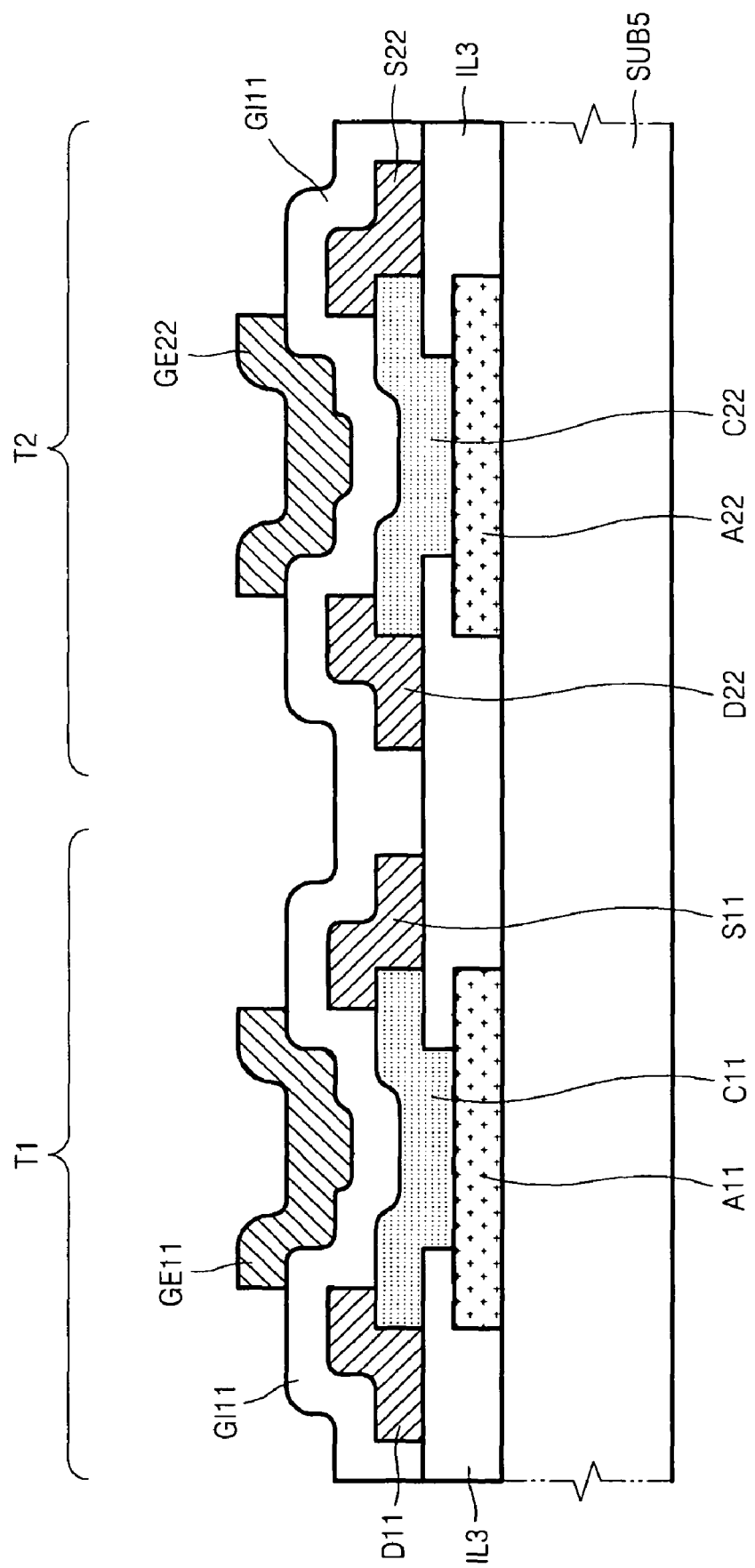
FIGS. 12 and 13 are cross-sectional views of semiconductor devices including transistors (similar to the transistors shown in FIG. 1) according to example embodiments.

FIG. 12 is a cross-sectional view of a semiconductor device including transistors according to example embodiments.

Referring to FIG. 12, a first threshold voltage adjusting layer A11 and a second threshold voltage adjusting layer A22 may be separated from each other on a substrate SUB5. The first threshold voltage adjusting layer A11 may have a small work function, and the second threshold voltage adjusting layer A22 may have a large work function. An insulating layer IL3 having holes exposing a part (or portion) of the first and second threshold voltage adjusting layers A11 and A22 may be formed on the substrate SUB5. A first channel layer C11 contacting a part (or portion) of the first threshold voltage adjusting layer A11 and a second channel layer C22 contacting a part (or portion) of the second threshold voltage adjusting layer A22 may be formed on the insulating layer IL3. The first and second channel layers C11 and C22 may be formed of the same (or similar) material.

The work function of the first threshold voltage adjusting layer A11 may be smaller than that of the first channel layer C11. The work function of the second threshold voltage adjusting layer A22 may be greater than that of the second channel layer C22. A first source electrode S11 and a first drain electrode D11, which contact both (or opposing) ends of the first channel layer C11, may be formed on the insulating layer IL3. A second source electrode S22 and a second drain electrode D22, which contact both (or opposing) ends of the second channel layer C22, may be formed on the insulating layer IL3.

According to example embodiments, the first source electrode S11 and the second drain electrode D22 may be formed integrally with each other. A gate insulating layer GI11, which covers the first and second channel layers C11 and C22, the first and second source electrodes S11 and S22 and the first and second drain electrodes D11 and D22, may be formed on the insulating layer IL3. A first gate electrode GE11 may be formed on the gate insulating layer GI11 above the first channel layer C11.

A second gate electrode GE11 may be formed on the gate insulating layer GI11 above the second channel layer C22. The first threshold voltage adjusting layer A11, the first channel layer C11, the first source electrode S11, the first drain electrode D11, the gate insulating layer GI11, and the first gate electrode GE11 form a transistor T1. The second threshold voltage adjusting layer A22, the second channel layer C22, the second source electrode S22, the second drain electrode D22, the gate insulating layer GI11, and the second gate electrode GE22 form a transistor T2.

According to example embodiments, the work function of the first threshold voltage adjusting layer A11 is smaller than that of the first channel layer C11. The work function of the second threshold voltage adjusting layer A22 is larger than that of the second channel layer C22. The threshold voltage of the transistor T2 may be greater than that of the transistor T1. For example, the threshold voltage of the transistor T1 may be a negative voltage and the threshold voltage of the transistor T2 may be a positive voltage. As such, the transistor T1 may be a depletion mode transistor, and the transistor T2 may be an enhancement mode transistor. If the first and second channel layers C11 and C22 are oxide layers, the semiconductor device according to example embodiments may include a depletion mode oxide TFT and an enhancement mode oxide TFT. The semiconductor device may have increased properties similar to complementary metal oxide semiconductor (CMOS) devices.

FIG. 12 shows a semiconductor device according to example embodiments including two transistors T1 and T2 similar to the transistor of FIG. 1. However, example embodiments are not limited thereto. The semiconductor device may include two or more transistors similar to the transistor of FIG. 2 through FIG. 4. According to example embodiments, one of the two transistors T1 and T2 may not include a threshold voltage adjusting layer.

The semiconductor device according to example embodiments may be used in various circuits. For example, the semiconductor device according to example embodiments may be used as a basic element in various logic circuits (e.g., inverters, NAND gates, NOR gates, encoders, decoders, multiplexers (MUX), demultiplexers (DEMUX) and sense amplifiers).

FIG. 13 shows a cooperative relationship between components and terminals if the semiconductor device of FIG. 12 is used as an inverter.

Referring to FIG. 13, a power source terminal VDD may be connected to the first drain electrode D11. An input terminal Vin may be connected to the second gate electrode GE22. The first source electrode S11, the second drain electrode D22, and the first gate electrode GE11 may be connected to an output terminal Vout. The second source electrode S22 may be grounded. According to other example embodiments, the first gate electrode GE11 may be grounded, instead of being connected to the output terminal Vout. If a voltage of 0V is applied to the input terminal Vin (e.g., if the transistor T2 (switching transistor) is turned off), a substantially high voltage is detected from the output terminal Vout if a substantially high power voltage is applied to the first drain electrode D11 of the transistor T1 (load transistor) through the power source terminal VDD. If the power voltage is continuously applied to the first drain electrode D11 of the transistor T1, most (or substantially all) of the electric current flows to the ground through the transistor T2 if the transistor T2 is turned on by applying a voltage that is equal to the threshold voltage or greater than the input terminal Vin. As such, a voltage of a low level is detected at the output terminal Vout. The voltage output from the output terminal Vout may be changed according to the voltage applied to the input terminal Vin if the power voltage is fixed.

The transistor T1 may be a depletion mode transistor and the transistor T2 may be an enhancement mode transistor. As such, the inverter according to example embodiments may be an enhancement/depletion (E/D) inverter. The inverter and a logic circuit including the inverter may be applied to various fields (e.g., liquid crystal display (LCD) devices, organic light emitting devices (OLEDs) and memory devices). In particular, the two transistors in the inverter (the load transistor and the switching transistor) may be oxide TFTs. The oxide TFTs may be fabricated using a substantially low temperature fabrication process and/or have increased mobility. The E/D inverter including the oxide TFTs according to example embodiments may be applied as a peripheral device of a three-dimensional stack memory fabricated in a low temperature fabrication process (e.g., a 1D(diode)-1R(resistor) multilayer cross point memory device).

FIG. 14 is a plan view of an inverter according to example embodiments.

Referring to FIG. 14, a first threshold voltage adjusting layer A11 and a second threshold voltage adjusting layer A222 may be separated from each other on a substrate (not shown). The first and second threshold voltage adjusting layers A111 and A222 may be formed of different materials from each other. The first and second threshold voltage adjusting layers A111 and A222 may have work functions that are different from each other. For example, the first threshold voltage adjusting layer A111 may have a small work function, and the second threshold voltage adjusting layer A222 may have a large work function. A channel layer C111 that covers the first and second threshold voltage adjusting layers A111 and A222 may be formed on the substrate. The channel layer C111 may be an oxide layer that is similar to the channel layer C1 of FIG. 1.

According to example embodiments, the channel layer C111 may be formed as a plate that completely covers the first and second threshold voltage adjusting layers A111 and A222. However, example embodiments are not limited thereto. According to example embodiments, the channel layer may include a first channel layer pattern that covers the first threshold voltage adjusting layer A111 and a second channel layer pattern that covers the second threshold voltage adjusting layer A222.

The work function of the first threshold voltage adjusting layer A11 may be smaller than that of the channel layer C111. The work function of the second threshold voltage adjusting layer A222 may be larger than that of the channel layer C111. A threshold voltage in a portion of the channel layer C111 located (or positioned) on the first threshold voltage adjusting layer A111 may be low, and a threshold voltage in a portion of the channel layer C11 located on the second threshold voltage adjusting layer A222 may be substantially high.

A first source electrode S111, a first drain electrode D111, a second source electrode S222, and a second drain electrode D222 may be formed on the channel layer C111. The first source electrode S111 and the first drain electrode D111 may be formed on both (or opposing) ends of the channel layer C111 located (or positioned) on the first threshold voltage adjusting layer A111. The second source electrode S222 and the second drain electrode D222 may be formed on both (or opposing) ends of the channel layer C111 located (or positioned) on the second threshold voltage adjusting layer A222.

A gate insulating layer (not shown), which covers the channel layer C111, the first and second source electrodes S111 and S222, and the first and second drain electrodes D111 and D222, may be provided. A first gate electrode GE111 and a second gate electrode GE222 may be formed on the gate insulating layer. The first gate electrode GE111 may cross over (or be positioned substantially perpendicular to) a portion of the channel layer C111 between the first source electrode S111 and the first drain electrode D111. The second gate electrode GE222 may cross over (or be positioned substantially perpendicular to) a portion of the channel layer C111 between the second source electrode S222 and the second drain electrode D222.

The first threshold voltage adjusting layer A111, the first source electrode S111, the first drain electrode D111, the portion of channel layer C111 between the first source electrode S111 and the first drain electrode D11, the gate insulating layer and the first gate electrode GE111 form a first transistor. The second threshold voltage adjusting layer A222, the second source electrode S222, the second drain electrode D222, the portion of channel layer C111 between the second source electrode S222 and the second drain electrode D222, the gate insulating layer and the second gate electrode GE222 form a second transistor.

The first transistor may be a depletion mode driving transistor, and the second transistor may be an enhancement mode switching transistor. The first and second transistors may be oxide transistors. Cooperative relationships between the first and second source electrodes S111 and S222, the first and second drain electrodes D111 and D222, the first and second gate electrodes GE111 and GE 222, the power source terminal VDD, the input terminal Vin and the output terminal Vout may be same as those of FIG. 13.

According to example embodiments, a threshold voltage of a transistor is adjusted using a threshold voltage adjusting layer, without performing a doping operation. A semiconductor device including two transistors having different threshold voltages from each other (e.g., the depletion mode transistor and the enhancement mode transistor) may be fabricated without performing an impurity doping and annealing to activate the doped impurities. Problems caused by an impurity dispersion may be prevented, and/or gaps between the components may be reduced. The two transistors may be close to each other. The integrity of the device may increase. Even if the first and second threshold voltage adjusting layers A111 and A222 are doped semiconductor layers, a high temperature process (e.g., annealing) may not be required after forming the first and second threshold voltage adjusting layers A111 and A222. As, an out-diffusion of the impurities from the first and second threshold voltage adjusting layers A111 and A222 may be reduced (or prevented).

It should be understood that example embodiments described therein should be considered in a descriptive sense only and not for purposes of limitation. Descriptions of aspects within the example embodiments should typically be considered as available for other similar aspects in other embodiments. For example, an idea of the embodiments may be applied to other transistors, in addition to the TFT. In addition, components and structures of the transistors shown in FIGS. 1 through 4, 9 and FIGS. 12 through 14 may be modified. In more detail, the transistor according to example embodiments may have a double-gate structure.

What is claimed is:
1. A transistor, comprising:
a first channel layer;
a first threshold voltage adjusting layer directly contacting the first channel layer;
a first source electrode and a first drain electrode contacting opposing ends of the first channel layer;

a first gate electrode separated from the first channel layer; and a first gate insulating layer between the first channel layer and the first gate electrode, wherein the first channel layer is between the first threshold voltage adjusting layer and the first gate insulating layer, and the first threshold voltage adjusting layer is separated from at least one of the first source electrode and the first drain electrode.

2. The transistor of claim 1, wherein the first threshold voltage adjusting layer has a work function that is different from a work function of the first channel layer.

3. The transistor of claim 1, wherein the first threshold voltage adjusting layer includes at least one selected from group consisting of a metal and a semiconductor.

4. The transistor of claim 3, wherein the semiconductor is doped with conductive impurities.

5. The transistor of claim 1, wherein the first channel layer is an oxide layer.

6. The transistor of claim 1, wherein the first gate electrode is above the first channel layer.

7. The transistor of claim 1, wherein the first gate electrode is below the first channel layer.

8. The transistor of claim 6, further comprising:

an insulating layer on the first threshold voltage adjusting layer, the insulating layer having a hole that exposes a portion of the first threshold voltage adjusting layer, wherein the first channel layer contacts the exposed portion of the first threshold voltage adjusting layer.

9. The transistor of claim 6, wherein the first threshold voltage adjusting layer is on a substrate, and the first channel layer covers a top surface and side surfaces of the first threshold voltage adjusting layer.

10. The transistor of claim 6, further comprising:

an insulating layer having a groove on a substrate, wherein the first threshold voltage adjusting layer is in the groove, and the first channel layer is on the insulating layer such that the first channel layer covers the first threshold voltage adjusting layer.

11. A semiconductor device, comprising:

a first transistor and a second transistor, wherein the first transistor is the transistor according to claim 1.

12. The semiconductor device of claim 11, wherein the first transistor and the second transistor have threshold voltages that are different from each other.

13. The semiconductor device of claim 12, wherein one of the first and second transistors is an enhancement mode transistor and the other of the first and second transistors is a depletion mode transistor.

14. The semiconductor device of claim 11, wherein the second transistor includes:

a second channel layer;

a second threshold voltage adjusting layer contacting the second channel layer;

a second source electrode and a second drain electrode contacting opposing ends of the second channel layer;

a second gate electrode separated from the second channel layer; and a second gate insulating layer between the second channel layer and the second gate electrode, wherein the second channel layer is between the second threshold voltage adjusting layer and the second gate insulating layer.

15. The semiconductor device of claim 14, wherein the second threshold voltage adjusting layer has a work function that is different from a work function of the second channel layer.

16. The semiconductor device of claim 14, wherein the first threshold voltage adjusting layer has a work function larger than a work function of the first channel layer, and the second threshold voltage adjusting layer has a work function smaller than a work function of the second channel layer.

17. The semiconductor device of claim 14, wherein the first threshold voltage adjusting layer has a work function smaller than a work function of the first channel layer, and the second threshold voltage adjusting layer has a work function larger than a work function of the second channel layer.

18. The semiconductor device of claim 14, wherein the second threshold voltage adjusting layer is separated from the second source electrode and the second drain electrode.

19. The semiconductor device of claim 14, wherein the second threshold voltage adjusting layer includes at least one selected from the group consisting of a metal and a semiconductor.

20. The semiconductor device of claim 19, wherein the semiconductor is doped with conductive impurities.

21. The semiconductor device of claim 14, wherein the first and second channel layers are formed of a same material.

22. The semiconductor device of claim 11, wherein the semiconductor device is a logic device.

23. A transistor, comprising:

a first channel layer;

a first threshold voltage adjusting layer contacting the first channel layer;

an insulating layer on the first threshold voltage adjusting layer, the insulating layer having a hole that exposes a portion of the first threshold voltage adjusting layer, wherein the first channel layer contacts the exposed portion of the first threshold voltage adjusting layer;

a first source electrode and a first drain electrode contacting opposing ends of the first channel layer;

a first gate electrode separated from the first channel layer, the first gate electrode being above the first channel layer; and a first gate insulating layer between the first channel layer and the first gate electrode, wherein the first channel layer is between the first threshold voltage adjusting layer and the first gate insulating layer.

* * * * *